United States Patent
Striker

(10) Patent No.: US 6,326,780 B1
(45) Date of Patent: *Dec. 4, 2001

(54) MAGNETIC FIELD CONCENTRATOR ARRAY FOR ROTARY POSITION SENSORS

(75) Inventor: David Lee Striker, Plymouth, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/203,248

(22) Filed: Dec. 1, 1998

(51) Int. Cl.[7] ................... G01B 7/30; G01R 33/06
(52) U.S. Cl. ................... 324/207.21; 324/207.2; 324/207.25
(58) Field of Search ............... 324/207.21, 207.25, 324/207.2, 207.12, 207.22, 251, 252, 207.13, 247, 249; 338/32 R, 32 H

(56) References Cited

U.S. PATENT DOCUMENTS

| | | |
|---|---|---|
| 3,194,990 | 7/1965 | Kendall . |
| 5,055,781 * | 10/1991 | Sakakibara et al. ............ 324/207.21 |
| 5,072,181 | 12/1991 | Burger . |
| 5,243,279 | 9/1993 | Bajat et al. . |
| 5,528,139 | 6/1996 | Oudet et al. . |
| 5,568,048 | 10/1996 | Schroeder et al. . |
| 5,644,226 | 7/1997 | Aoyama et al. . |
| 5,680,042 | 10/1997 | Griffen et al. . |
| 6,191,579 * | 2/2001 | Striker ............................. 324/207.25 |

FOREIGN PATENT DOCUMENTS

| | | |
|---|---|---|
| 19532674 * | 5/1995 | (DE) . |
| WO 96/41120 A1 | 12/1996 | (WO) . |
| WO 98/08060 A1 | 2/1998 | (WO) . |
| WO 98/48244 A1 | 10/1998 | (WO) . |
| WO 98/54541 A1 | 12/1998 | (WO) . |
| WO 99/54684 A1 | 10/1999 | (WO) . |

* cited by examiner

*Primary Examiner*—Safet Metjahic
*Assistant Examiner*—Anthony Jolly
(74) *Attorney, Agent, or Firm*—Steven L. Oberholtzer; Brinks Hofer Gilson & Lione

(57) ABSTRACT

A magnetic rotary position sensor including a base (20) upon which a plurality of radially extending magnetic sensing elements (22) are mounted. Interleaved with the sensing elements (22) are a plurality of uniformly spaced magnetic concentrators (30). The sensor assembly (18) is placed in a uniform magnetic field created, for example, by opposite polarity magnets (32, 34) mounted on opposite sides of the sensor assembly, and rotatable relative to it. The relative rotary position of the sensor assembly to the magnetic field is determined by comparing the relative values of the sensor elements (22) in the array to each other.

16 Claims, 4 Drawing Sheets

MAGNETIC FIELD CONCENTRATOR ARRAY FOR ROTARY POSITION SENSORS

FIELD OF THE INVENTION

The present invention relates to magnetic position sensors and more particularly to magnetic field concentrators employed in a rotary magnetic sensor.

BACKGROUND OF THE INVENTION

For mechanisms having one portion that rotates relative to another, it is often necessary to know the precise relative rotational position between the two portions. There are many types of sensor arrangements that can accomplish such a task; however, many have drawbacks in that they are too large for a particular application, too expensive to design and fabricate, or require extensive calibration once assembled in the mechanism.

These types of sensors can be used, for example as throttle position sensors, fuel accumulators, transmission position sensors, steering angle sensors, and gear tooth sensors. Many other types of applications of course can also benefit from having rotational position sensing.

Also, of course, it is desirable that the sensor be as inexpensive and easy to fabricate and assemble as possible in order to minimize the cost of the sensor assembly.

Consequently, it is desirable to have a rotational position sensor that does not need calibration, or may need only minimal calibration, is small in size, cost effective, and still reliable.

SUMMARY OF THE INVENTION

In its embodiments, the present invention contemplates a magnetic rotary position sensor. The sensor includes means for producing a generally uniform magnetic field over a sensor region, and a mounting base having a center of relative rotation between the base and the magnetic field. A plurality of generally triangular shaped concentrators are generally uniformly spaced about the center of relative rotation within the predetermined area, with each of the concentrators spaced from adjacent concentrators to form gaps, and with the concentrators made of a magnetizable material. Also, a plurality of magnetic field sensors are mounted to the base and extend radially outward from the center of relative rotation, with each of the magnetic field sensors located in a different one of the gaps. The sensor also includes means for communicating signals through each of the magnetic field sensors.

Accordingly, an object of the present invention is to direct a generally uniform magnetic field across a rotary position sensor assembly such that the magnetic field strength appearing across each individual sensing element of the array is related to the direction of the magnetic field relative to that particular element.

An advantage of the present invention is that the magnetic flux is distributed by the concentrators in a controlled manner over multiple magnetic field sensing elements.

Another advantage of the present invention is that this sensor array can be used with various types and sizes of magnetic field sensing elements. While this invention will operate on large scale assemblies, it will also operate effectively on very small scale assemblies, including micro-scale sensors with the structure built up on a ceramic chip or on a silicon chip which may or may not also contain additional electronic components.

A further advantage of the present invention is that magnetic field direction and hence rotary sensor position can be determined by comparing the responses of the individual sensing elements in the array to each other, without the need for precise temperature and magnetic field calibration in the final assembly.

An additional advantage of the present invention is that the arrangement of the sensor array can be configured so as to make assembly and alignment of the array onto a chip easier.

Another advantage of the present invention is that different configurations of magnets, for producing a magnetic field on the sensor array, can be employed to allow for flexibility of design for the sensor assembly.

DETAILED DESCRIPTION OF THE PREFERRED EMBODIMENTS

Figure 1:
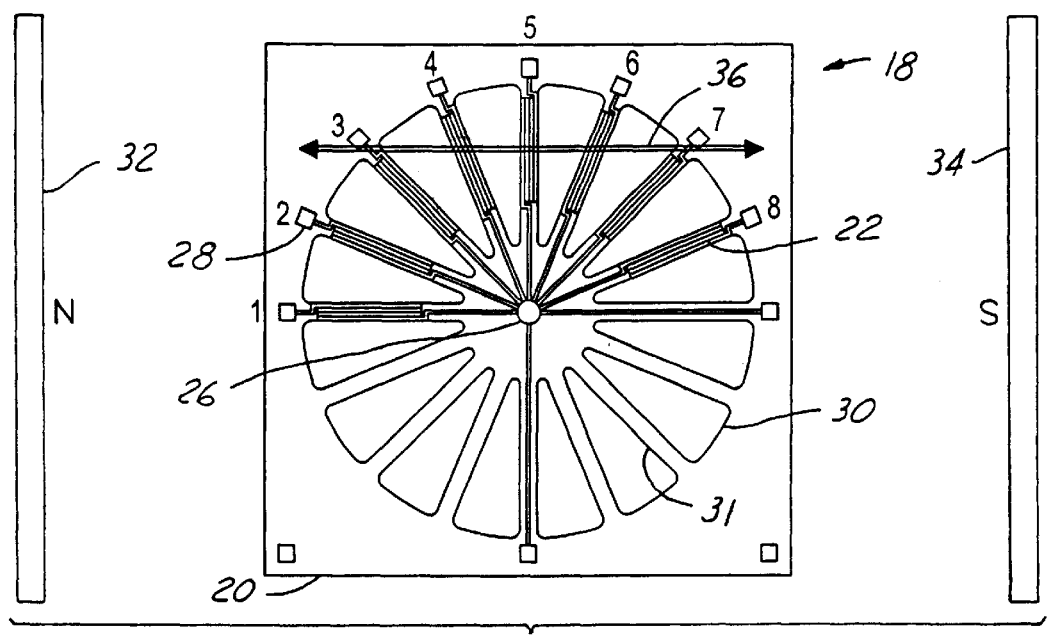
FIG. 1 is a schematic view illustrating a first embodiment of the sensor array of the present invention.

FIG. 1 illustrates a sensor assembly 18 including a silicon chip 20 having an array of eight giant magnetoresistive (GMR) elements 22 mounted thereon. The silicon chip 20 carries the array structure itself, with the added advantage that, if desired, electronic circuitry can be formed on the same chip since GMR multilayer element construction and semiconductor processes are compatible, thus forming a circuit board that also processes the sensor information. The magnetic sensor assembly 18 itself can have very small dimensions, for example, as small as 4 millimeters by 4 millimeters.

The chip 20 may also be formed from ceramic, if so desired.

The array of GMR elements 22 is mounted extending radially with 22.5 degree separation between each one; each GMR element is numbered, 1–8. The GMR elements 22 themselves are similar to those described in U.S. patent application Ser. No. 09/154,868, filed Sep. 17, 1998, incorporated herein by reference, and can be wire bonded, if so desired, to the circuit board 20 and covered with a protective encapsulation material. While this array of magnetic field sensing elements is illustrated as GMR resistors, it need not be; it can also be formed from other magnetic field sensors, for example, Hall effect sensors, magnetoresistive sensors, etc. The GMR elements 22 are connected at their radial inward ends to an inner wire bond pad 26 and at the outer ends to outer wire bond pads 28. The bond pads 26 and 28 are then connected to processing circuitry, not shown, for employing the sensor outputs in rotational angle calculations. The bond pads can instead be solder bumps, if so desired.

Also mounted on the Chip 20, in a uniform radial pattern interleaved with the GMR elements 22, are concentrators 30. The concentrators 30 are generally triangular shaped, each one being generally the same size, and are formed of a magnetizable material. The magnetizable material may be any soft ferromagnetic material such as iron, nickel-iron alloys, nickel and some ferrites. The pattern of the concentrators 30 is extended to complete a 360 degree layout, even though the pattern of the GMR elements 22 is less than 180 degrees. Thus, the shape of all of the concentrators 30 is uniform, as is the spacing between them that forms gaps 31 within which the GMR elements 22 are mounted. The uniformity is used to maintain control of the magnetic flux pattern.

There is a magnetic north pole 32 and a parallel magnetic south pole 34 spaced from, on opposite sides of, and facing the sensor assembly 18. These magnetic poles 32 and 34 are rotatable relative to the sensor assembly about the same axis as the sensor array has. For this configuration, then, a relatively uniform magnetic field, indicated by arrow 36, is created from left to right in FIG. 1, across the sensor assembly 18, and can be rotated relative to the assembly while remaining uniform. The uniform magnetic field can also be formed by a ring magnet, as will be discussed in relation to the fourth embodiment below.

Figure 2:
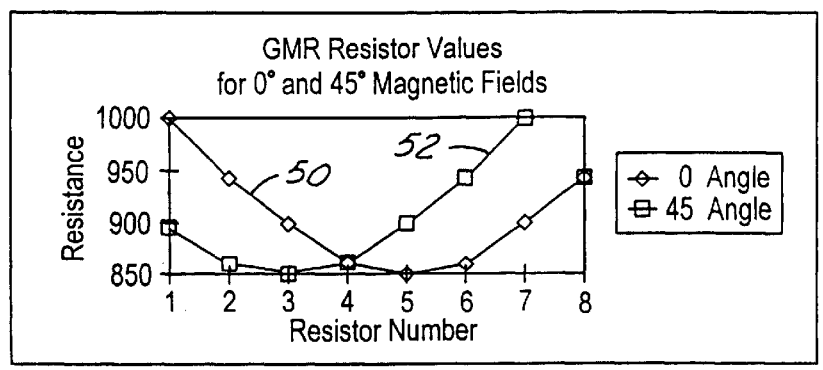
FIG. 2 is a graph illustrating the resistance changes that take place in the GMR elements of FIG. 1 depending upon their orientation relative to a uniform magnetic field.

When this parallel magnetic field is introduced across the sensor assembly 18, the magnetic field lines are directed in a controlled manner across the gaps 31 between the concentrators 30. As a result, if this uniform magnetic field 36 is introduced across the sensor assembly 18, then the magnetic field lines will appear in the general direction indicated in FIG. 3B; for the discussion in relation to FIGS. 1–3C, this will be considered the zero degree direction. One will note that the magnetic field lines will cross GMR element 5 generally perpendicular to the direction that this element extends. This will result in GMR element 5 being subject to the strongest magnetic flux of any GMR element because almost half the magnetic flux passing through the sensor array 22 will cross it. Line 50 in FIG. 2 shows that the resistance in the GMR element 5 for this zero degree direction of the magnetic field is at a minimum value of about 850 ohms. The resistance values used herein are only examples of values that may be used for a particular application and assumes that the GMR elements in this example have a resistance of 1000 ohms at zero magnetic field strength and a decreasing resistance with an increasing magnetic field strength.

On the other hand, when this zero degree magnetic field crosses GMR element 1, there will be virtually no magnetic flux crossing it because the field will pass through the adjacent concentrators 30. Consequently, the resistance in GMR element 1 will be almost 1000 ohms, as is also indicated by line 50 in FIG. 2. With the configuration of the concentrators 30 in this sensor assembly 18, the remaining GMR elements 2–4 and 7–8 will be subjected to magnetic field strengths that vary approximately as the sine of the angle between the field direction and the radial centerline of the particular element. Thus, the magnitude of each of the element resistances, as the sensor is rotated relative to the magnets, generally varies in a sinusoidal fashion between a minimum and maximum resistance. So for this example, GMR elements 2 and 8 will be reduced from the 1000 ohms base value by sin(22.5°) multiplied by the difference between the resistance values of GMR elements 1 and 5. GMR elements 3 and 7 will also be reduced, but by a factor of sin(45°). Likewise, GMR elements 3 and 6 will have a factor of about sin(67.5°).

Figures 3A, 3B:
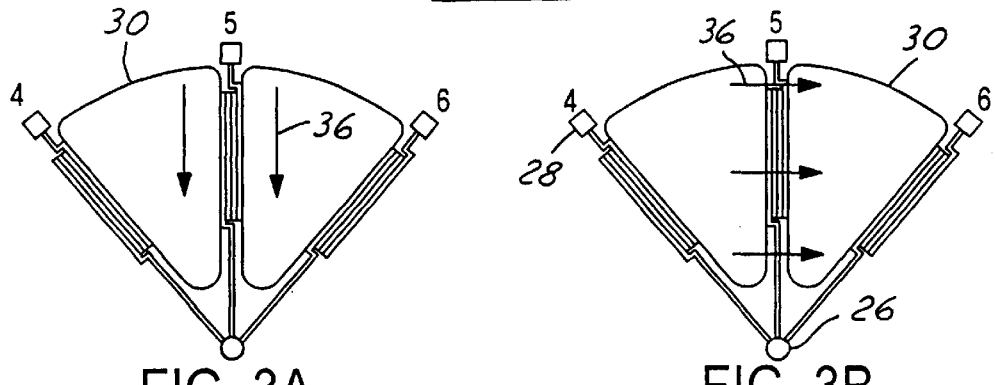
FIGS. 3A–3C are enlarged views of a portion of the sensor array of FIG. 1, illustrating the array in different positions of rotation relative to a uniform magnetic field.
Figure 3C:
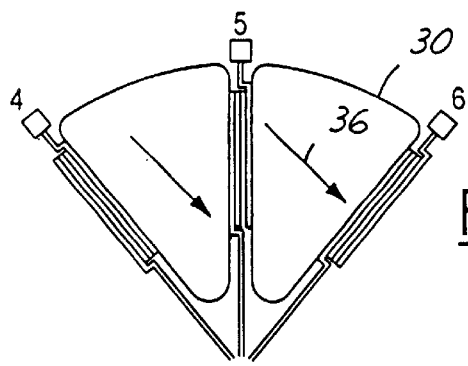

FIG. 3C shows an example where 45 degrees of relative rotation has occurred; the resulting change in resistance for the GMR elements, is indicated by line 52 of FIG. 2. FIG. 3A illustrates that at 90 degrees rotation of the magnetic field 36, GMR element 5 now will be exposed to the same magnetic flux as GMR element 1 was at zero degrees rotation.

As can be seen from FIGS. 1–3C, the shape and positioning of the concentrators 30 in the sensor assembly 18 are such that if a relatively parallel magnetic field (preferably at less than concentrator magnetic saturation level) is placed across the array of concentrators 30, the field will be directed in a controlled manner across the magnetic field sensing devices, in this case the array of GMR elements 22. The individual sensing elements within the array 22 are subjected to different, but predictable, magnetic field conditions depending on their own location. The reaction of each GMR element within the array of sensing elements 22 can then be measured and compared to the reaction of the other elements. Field direction is determined by these comparisons between the elements.

The processing can then be done by an applicable electronic processing method to provide an analog, pulse width modulated, or digital word signal indicating magnetic field direction by comparing the relative resistances between the GMR elements in the array 22. For example, the method disclosed in U.S. patent application Ser. No. 08/887,061 filed Jul. 2, 1997 and incorporated herein by reference, may be employed. Consequently, absolute resistance of any single GMR element is not needed to determine rotational position, and so the need for calibration to magnetic field strength is substantially reduced and in most instances may be eliminated.

One will note that in this first embodiment, since the GMR elements in the array 22 react to the strength of the magnetic field independent of field polarity, they will change the same amount regardless of the polarity, i.e. whether a magnetic field crosses, for example, from left to right or right to left, through the sensor assembly 18. Consequently, the embodiment of the sensor assembly in FIG. 1 is only applicable for measuring 180 degrees of rotation because more rotation than that will merely repeat the pattern.

Figure 4:
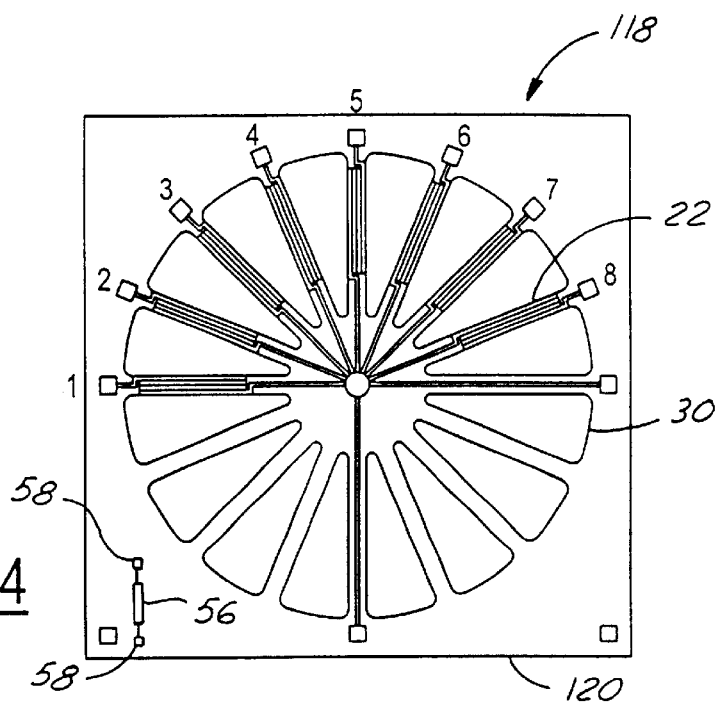
FIG. 4 is a schematic view of a second embodiment of the sensor assembly.

FIG. 4 illustrates a second embodiment of a rotary position sensor which allows for full 360 degree rotational angle measurement by the addition of the ability to indicate field direction. For this embodiment similar elements are numbered the same as the first embodiment, while modified elements are given 100 series numbers. The sensor assembly 118 now includes a Hall effect sensor 56. The Hall effect sensor 56 is mounted to the chip 120 close enough to the sensor array 22 so that it will also be in the uniform magnetic field. It has bond pads 58 on the chip 120 that will connect to the electronic sensor circuitry, not shown, in the same manner as the GMR elements of the array 22.

Since the hall sensor 56 can detect polarity as well as magnitude of a magnetic field, it will reverse polarity at 180 degrees of relative rotation, providing an identifier of polarity. The Hall sensor 56 will put out a positive or negative voltage depending on the magnetic field polarity. The rotational position within each 180 degrees of rotation, then, will still be provided by the GMR element array 22. If desired, the Hall sensor can be mounted in the sensor array, but need not be since it is not being used in this instance for detecting the field strength. Although, for the first and second embodiment, Hall sensors can be used to replace all of the GMR elements in the sensor array itself and provide an intrinsic field direction along with the field strength. So, the sensor assembly can employ only Hall sensors and determine accurate rotational positions. But one of the drawbacks to the Hall sensor configuration is that it will likely be more complicated and expensive to produce the sensor array.

Figure 5:
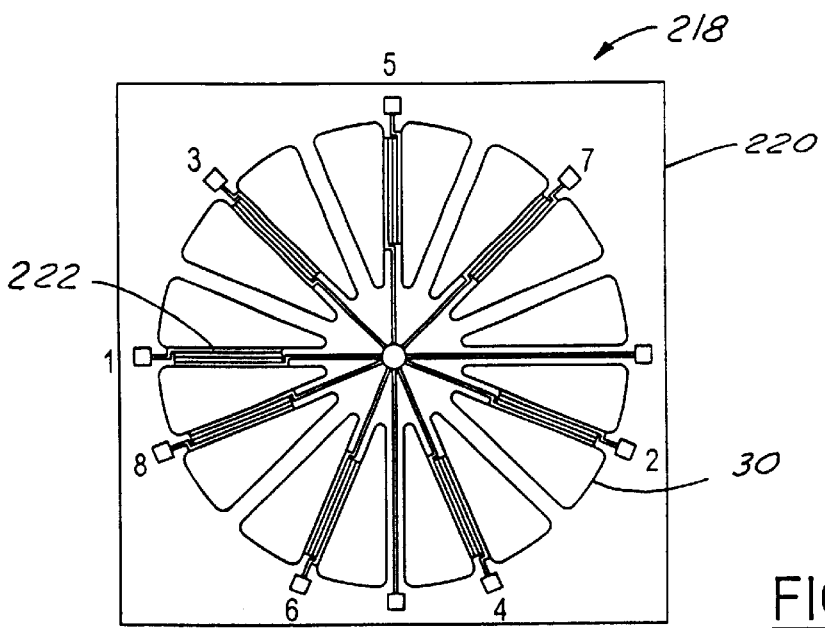
FIG. 5 is a schematic view of a third embodiment of the sensor assembly.

FIG. 5 illustrates a third embodiment of a rotary position sensor, similar to the first embodiment, but with the array of GMR elements 222 positioned differently on the chip 220 to form the sensor assembly 218. For this embodiment, modified elements from the first embodiment will be given 200 series numbers. The concentrators 30 are arranged the same as in the first embodiment. This embodiment illustrates that individual GMR elements 1–8 can be located at various locations within the array of concentrators 30 without reducing the effectiveness for determining rotational position. Being able to accommodate the various positions allows for optimizing the overall circuitry pattern, not shown, when it is desirable to have the sensor circuitry located on the same chip 220 as the sensor assembly 218.

Figure 6:
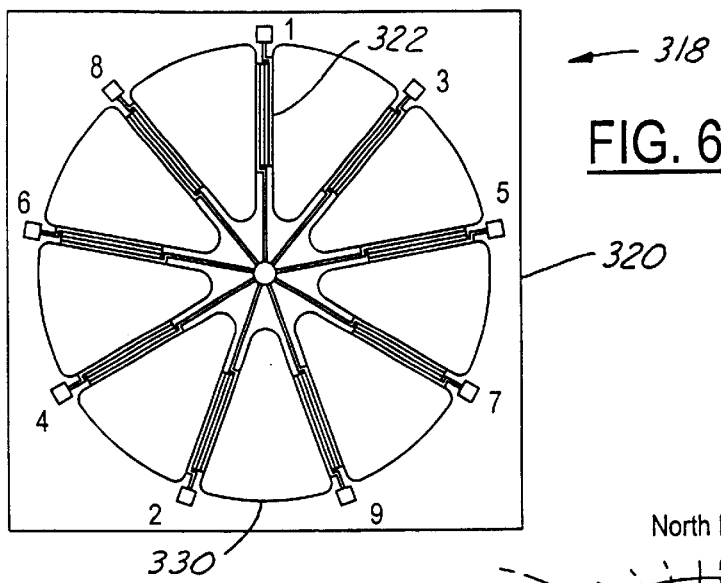
FIG. 6 is a schematic view of a fourth embodiment of the sensor assembly.

FIG. 6 illustrates a fourth embodiment of a rotary position sensor, similar to the first embodiment. For this embodiment, modified elements from the first embodiment will be given a 300 series number. The sensor assembly 318 now includes an array of nine GMR elements 322 mounted on the chip 320 rather than eight, with the elements 322 spaced with a greater angle (40 degrees) between them. To accommodate this change, the concentrators 330 are wider and there are of course fewer of them for this arrangement. Despite the fact that the array of sensor elements 322 is now spaced around a full 360 degrees, it will still only sense 180 degrees of rotational motion since all of the sensors in this array are shown as GMR elements. But with this embodiment as well, one can employ Hall effect sensor(s) to obtain a full 360 degree rotational sensing capability, if desired.

Figure 7:
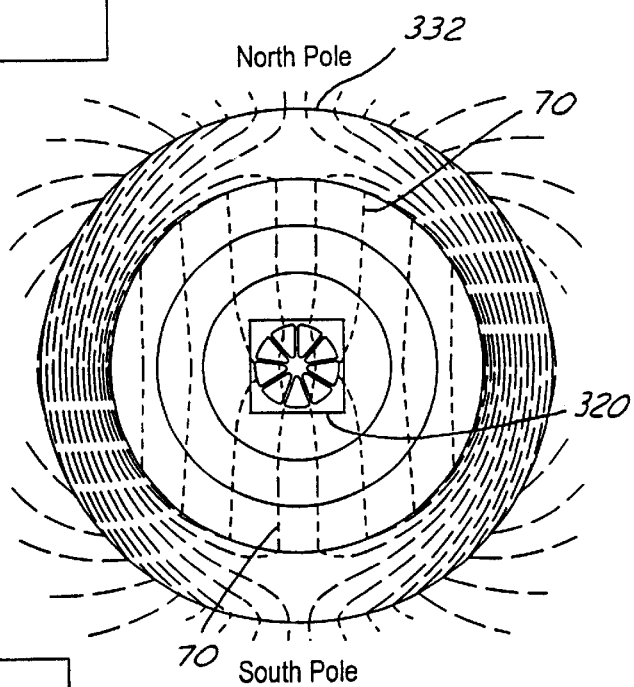
FIG. 7 is a view of the fourth embodiment illustrated in FIG. 6, on a reduced scale, illustrating flux equipotential lines as they pass from a ring magnet through the sensor array.
Figure 8:
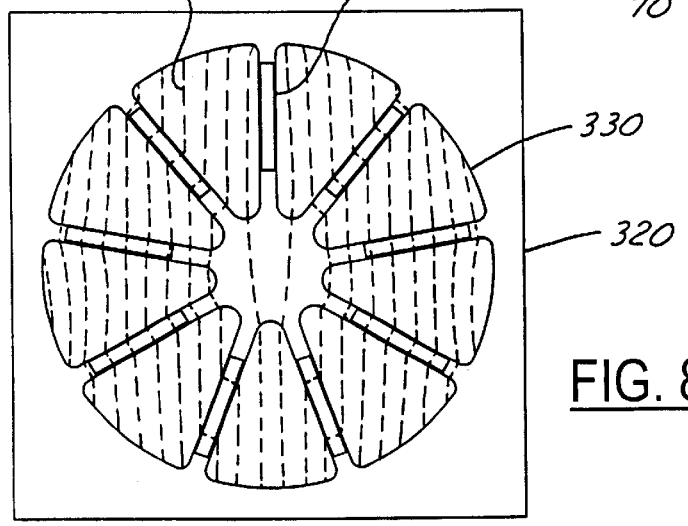
FIG. 8 is an enlarged view of a portion of FIG. 7, illustrating the flow of the flux equipotential lines on the sensor array.

FIGS. 7 and 8 illustrate magnetic field characteristics for the sensor array embodiment in FIG. 6. For this magnetic field measurement, the silicon substrate 320 upon which the sensor assembly 318 is mounted is about four millimeters by four millimeters, placed within a ring magnet 332 (employed rather than the magnets illustrated in FIG. 1). The concentrators 330 are formed from iron. The ring magnet 332 and sensor array 318 are rotatable relative to one another. One will note that the flux equipotential lines 70 (indicated by the dashed lines in FIGS. 7 and 8) overall are generally parallel and uniform, except in the immediate vicinity of the sensor assembly 318. FIG. 8 illustrates the enlarged view of the sensor assembly of FIG. 7 to more clearly show the magnetic flux equipotential lines 70 and how they are oriented through the sensor array 318 itself. One will note that the more parallel a sensor element is to the general direction of the flux equipotential lines 70, the less magnetic flux will be seen by that particular sensor. In this way, the relative magnitudes of the magnetic field sensed between the different sensors of the array can be used to determine the rotational position.

Figure 9:
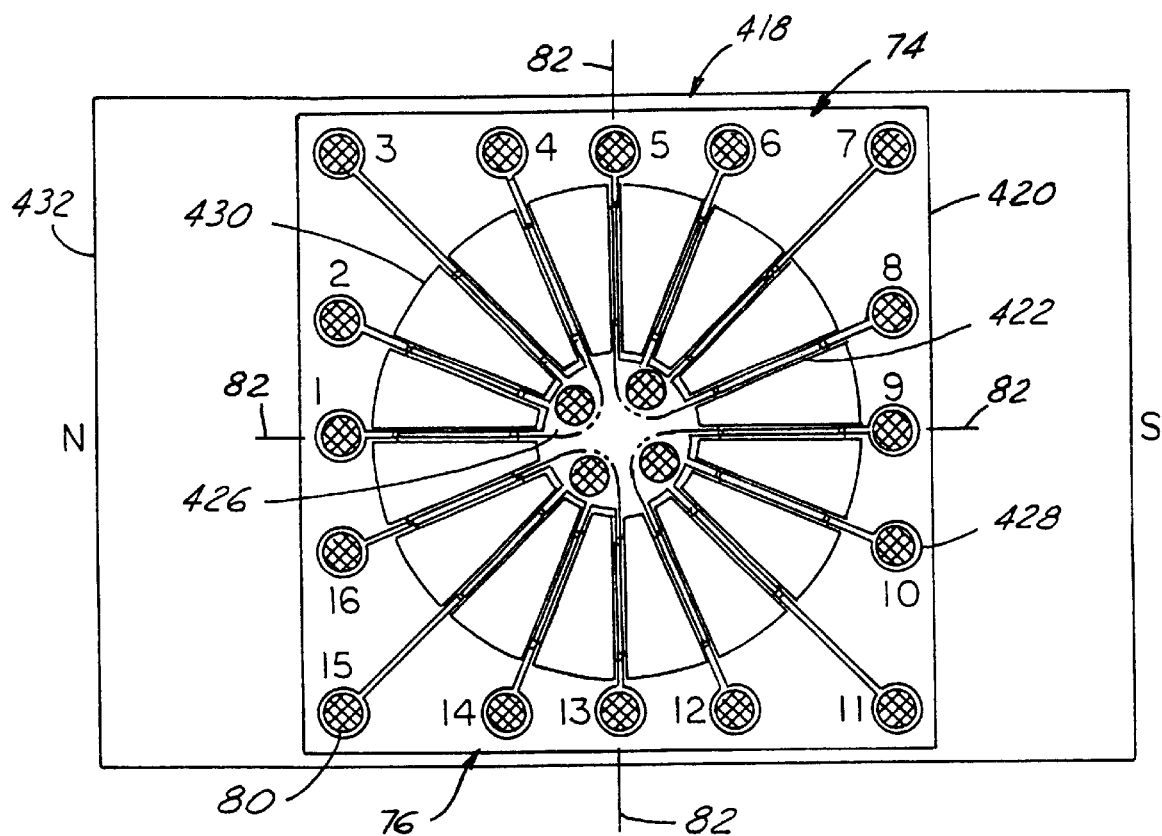
FIG. 9 is a schematic view of a fifth embodiment of the sensor assembly.

FIG. 9 illustrates a fifth embodiment of a rotary position sensor. This embodiment is of particular interest for applications that require a redundant output signal for the same rotational position measurement. For this embodiment, modified elements from the first embodiment will be given a 400 series number; also, the sensor assembly 418 in this embodiment contains a sensor array 422 of sixteen GMR elements, now numbered 1–16. The GMR elements numbered 1–8 are located about a first 180 degree arc of the assembly 418 and form a first set 74, while the GMR elements numbered 9–16 are located about a second 180 degree arc of the assembly 418 and form a second set 76 to mirror the first set 74. The second set 76 is 180 degrees out of phase with the first set 74. The first and second sets 74, 76 each form a different 180 degree sensing array that operates independently of the other set. The first set 74 connects to a first portion of sensor circuitry, not shown, and the second set 76 connects to a second portion of sensor circuitry. Each set 74, 76 will produce a signal indicating the relative rotational position to the magnetic field. So long as the two sets agree, the implication is that the sensors are working properly. But if the two sets 74, 76 do not agree as to the rotational position, then this indicates that some element within the sensor assembly has failed. Thus, this configuration provides redundancy to assure sensor failures are found.

This embodiment also illustrates a different way to produce the magnetic field. The magnetic field is produced by a rectangular magnet 432 that is mounted adjacent to and rotatable relative to the sensor assembly 418 about the central axis of the assembly. The magnet 432 is wider and longer that the sensor assembly 418 and located directly below the son-or assembly. With this arrangement, the magnetic field will be generally parallel from the north (N) to south (S) pole across the sensor assembly 418 except where it is directed by the concentrators 430. The flux lines will also have some symmetrical direction away from the plane of the sensor assembly 418, particularly nearer the magnetic poles. But that will not affect sensor performance since field direction is determined by comparison of the sensor elements within the array 422 and the concentrators 430 will still direct the magnetic field over the sensor elements 1–16 in a predictable manner.

Also, for this fifth embodiment, the sensor assembly 418 pattern is repetitive (i.e. Symmetrical) in each quadrant of the chip 420, demarcated by phantom lines 82. For this embodiment, the chip 420 can be, for example, made of ceramic. There are four inner bond pads 426, each of which connects to the radially inward ends of four adjacent sensing elements. All bond pads 426 and 428 are shown with solder bumps 80 for connection to processing circuitry, not shown. This symmetrical layout by quadrants is intended to foolproof orientation of the chip 420 when it is attached to processing circuitry, on a circuit board for example. The processing circuitry can then directly connect to the inner bond pad 426 of the sensing elements 1–4, to the inner bond pad of the sensing elements 5–8, the inner bond pad of sensing elements 9–12, and to the bond pad of elements 13–16. If the sensor assembly 418 is inadvertently rotated by 90, 180 or 270 degrees before assembly, to a circuit board for example, the rotational shift will be transparent. All bond pads 426 and 428 will still align with the circuit board pattern and the relocated sensing elements will provide the correct output for their location. Consequently, the potential for manufacturing error is reduced.

While different embodiments have been described herein, additional alternative embodiments are also contemplated to be within the scope of the present invention. For example, by increasing the number of sensing elements, the accuracy can be increased, if so desired, with the minimum quantity actually being only two sensing elements. The number, of course, depends upon the accuracy desired versus the cost and ease of fabrication.

So, while certain embodiments of the present invention have been described in detail, those familiar with the art to which this invention relates will recognize various alternative designs and embodiments for practicing the invention as defined by the following claims.

I claim:

1. A magnetic rotary position sensor comprising:
   a ring magnet for producing a generally uniform magnetic field over a sensor region;
   a mounting base having a center of relative rotation between the base and the magnetic field;
   a plurality of generally triangular shaped concentrators generally uniformly spaced about the center of relative rotation within the predetermined area, with each of the concentrators spaced from adjacent concentrators to form gaps, and with the concentrators made of a magnetizable material;
   a plurality of magnetic field sensors mounted to the base and extending radially outward from the center of relative rotation, with each of the magnetic field sensors located in a different one of the gaps; and
   means for communicating signals through each of the magnetic field sensors.

2. The sensor of claim 1 wherein the magnetic field sensors are giant magnetoresistor sensors.

3. The sensor of claim 1 wherein the plurality of magnetic field sensors are giant magnetoresistive sensors and the sensor further includes a Hall effect sensor mounted to the base in the magnetic field.

4. The sensor of claim 2 wherein mounting base is made of a ceramic material.

5. The sensor of claim 1 wherein the magnetic field sensors are Hall effect sensors.

6. The sensor of claim 1 wherein the mounting base is made of silicon.

7. The sensor of claim 1 wherein the concentrators are made of a ferromagnetic material.

8. The sensor of claim 1 wherein the concentrators are made at least partially from nickel.

9. The sensor of claim 1 wherein the plurality of magnetic field sensors are giant magnetoresistive sensors and the sensor further includes a Hall effect sensor mounted to the base in the magnetic field.

10. The sensor of claim 1 wherein the plurality of concentrators comprises sixteen concentrators of generally equal size extending circumferentially about the relative center of rotation 360 degrees, and the plurality of magnetic field sensors comprises eight sensors.

11. The sensor of claim 1 wherein the plurality of concentrators comprises nine concentrators of generally equal size extending circumferentially about the relative center of rotation 360 degrees, and the plurality of magnetic field sensors comprises nine sensors.

12. A magnetic rotary position sensor comprising:
    a ring magnet for producing a generally uniform magnetic field over a sensor region;
    a mounting base having a center of relative rotation between the base and the magnetic field;
    a plurality of generally triangular shaped concentrators generally uniformly spaced about the center of relative rotation within the predetermined area, with each of the concentrators spaced from adjacent concentrators to form gaps, and with the concentrators made of a magnetizable material;
    a plurality of giant magnetoresistive sensors mounted to the base and extending radially outward from the center of relative rotation, with each of the giant magnetoresistive sensors located in a different one of the gaps; and
    means for communicating signals through each of the giant magnetoresistive sensors.

13. The sensor of claim 12 wherein further including a Hall effect sensor mounted to the base in the magnetic field.

14. The sensor of claim 13 wherein the mounting base is made of silicon.

15. The sensor of claim 14 wherein the concentrators are made of a ferromagnetic material.

16. A magnetic rotary position sensor comprising:
    a ring magnet for producing a generally uniform magnetic field over a sensor region;
    a mounting base having a center of relative rotation between the base and the magnetic field;
    a plurality of generally triangular shaped concentrators generally uniformly spaced about the center of relative rotation within the predetermined area, with each of the concentrators spaced from adjacent concentrators to form gaps, and with the concentrators made of a magnetizable material;
    a plurality of Hall effect sensors mounted to the base and extending radially outward from the center of relative rotation, with each of the Hall effect sensors located in a different one of the gaps; and
    means for communicating signals through each of the Hall effect sensors.

* * * * *